(12) United States Patent
Jung et al.

(10) Patent No.: US 12,103,844 B2
(45) Date of Patent: *Oct. 1, 2024

(54) METHOD OF FABRICATING NANOSTRUCTURES USING MACRO PRE-PATTERNS

(71) Applicant: KOREA ADVANCED INSTITUTE OF SCIENCE AND TECHNOLOGY, Daejeon (KR)

(72) Inventors: Hee-Tae Jung, Daejeon (KR); Hwan-Jin Jeon, Daejeon (KR); Woo-Bin Jung, Daejeon (KR)

(73) Assignee: Korea Advanced Institute of Science and Technology, Daejeon (KR)

(*) Notice: Subject to any disclaimer, the term of this patent is extended or adjusted under 35 U.S.C. 154(b) by 367 days.

This patent is subject to a terminal disclaimer.

(21) Appl. No.: 14/923,910

(22) Filed: Oct. 27, 2015

(65) Prior Publication Data

US 2016/0089723 A1   Mar. 31, 2016

Related U.S. Application Data

(60) Continuation-in-part of application No. 14/511,992, filed on Oct. 10, 2014, now Pat. No. 9,180,519, which
(Continued)

(30) Foreign Application Priority Data

Jun. 29, 2010  (KR) .................. 10-2010-0062183

(51) Int. Cl.
*C23C 14/22*   (2006.01)
*B22F 1/054*   (2022.01)
(Continued)

(52) U.S. Cl.
CPC .......... *B81C 1/00031* (2013.01); *B22F 1/054* (2022.01); *B22F 7/04* (2013.01);
(Continued)

(58) Field of Classification Search
CPC .. B22F 1/0018; B22F 7/04; B22F 9/02; B81C 1/00031; C03C 17/006; C03C 2217/42;
(Continued)

(56) References Cited

U.S. PATENT DOCUMENTS 4,033,797 A * 7/1977 Dill ..................... H01L 21/033
257/E21.033
4,356,210 A * 10/1982 Imai ...................... H01L 21/31
438/33
(Continued)

FOREIGN PATENT DOCUMENTS

JP      2004-351608 A   12/2004
KR   10-2007-0056035 A    5/2007
(Continued)

OTHER PUBLICATIONS

Chakraborty et al. "Current conduction mechanism in TiO2gate dielectrics", Microelectronic Engineering 81 (2005) 188-193 (Year: 2005).*
(Continued)

*Primary Examiner* — Rodney G McDonald
(74) *Attorney, Agent, or Firm* — Rabin & Berdo, P.C.

(57) ABSTRACT

A method of fabricating nanostructures using macro pre-patterns according to the present invention, which comprises either depositing a target material on a substrate having macro pre-patterns formed thereon, or applying a target material to a substrate and then forming macro pre-patterns on the substrate, and then depositing the target material on the side surface of the macro pre-patterns by an ion bombardment phenomenon occurring during etching, provides a
(Continued)

three-dimensional nanostructures with high aspect ratio and uniformity can be fabricated by a simple process at low cost by using the ion bombardment phenomenon occurring during physical ion etching, thereby achieving the high performance of future nano-devices, such as nanosized electronic devices, optical devices, bio devices and energy devices.

8 Claims, 10 Drawing Sheets

Related U.S. Application Data is a division of application No. 13/081,276, filed on Apr. 6, 2011, now Pat. No. 8,889,245.

(51) Int. Cl.
| | | |
|---|---|---|
| B22F 7/04 | (2006.01) | |
| B22F 9/02 | (2006.01) | |
| B81C 1/00 | (2006.01) | |
| B82Y 10/00 | (2011.01) | |
| B82Y 30/00 | (2011.01) | |
| B82Y 40/00 | (2011.01) | |
| C03C 17/00 | (2006.01) | |
| C30B 23/00 | (2006.01) | |
| C30B 29/02 | (2006.01) | |
| C30B 29/16 | (2006.01) | |
| C30B 29/60 | (2006.01) | |
| C30B 33/08 | (2006.01) | |
| G03F 7/00 | (2006.01) | |

(52) U.S. Cl.
CPC .............. *B22F 9/02* (2013.01); *B82Y 10/00* (2013.01); *B82Y 30/00* (2013.01); *B82Y 40/00* (2013.01); *C03C 17/006* (2013.01); *C23C 14/221* (2013.01); *C30B 23/00* (2013.01); *C30B 29/02* (2013.01); *C30B 29/16* (2013.01); *C30B 29/60* (2013.01); *C30B 33/08* (2013.01); *G03F 7/0002* (2013.01); *G03F 7/0037* (2013.01); *C03C 2217/42* (2013.01); *C03C 2218/34* (2013.01); *Y10T 428/24479* (2015.01); *Y10T 428/24612* (2015.01)

(58) Field of Classification Search
CPC ... C03C 2218/34; C23C 14/221; C30B 23/00; C30B 29/02; C30B 29/16; C30B 29/60; C30B 33/08; B82Y 10/00; B82Y 30/00; B82Y 40/00; G03F 7/0002; G03F 7/0037; Y10T 428/24479; Y10T 428/24612
USPC .................. 204/192.3, 192.32, 192.34
See application file for complete search history.

(56) References Cited

U.S. PATENT DOCUMENTS

| | | | | |
|---|---|---|---|---|
| 4,432,132 | A * | 2/1984 | Kinsbron | H01L 21/28132 438/303 |
| 4,983,540 | A * | 1/1991 | Yamaguchi | B82Y 10/00 148/DIG. 160 |
| 6,791,125 | B2 * | 9/2004 | Demkov | H01L 29/513 257/192 |
| 7,923,075 | B2 | 4/2011 | Yeung et al. | |
| 9,180,519 | B2 * | 11/2015 | Jung | B81C 1/00031 |
| 2003/0185985 | A1 | 10/2003 | Bronikowski et al. | |
| 2004/0106245 | A1 * | 6/2004 | Butcher | H01L 43/12 257/E27.005 |
| 2004/0175848 | A1 * | 9/2004 | Chen | B82Y 10/00 257/E27.005 |
| 2008/0121610 | A1 | 5/2008 | Nagata et al. | |
| 2009/0078927 | A1 * | 3/2009 | Xiao | H01L 43/12 257/E29.166 |
| 2009/0184425 | A1 * | 7/2009 | Hu | H01L 23/53252 257/762 |
| 2013/0045416 | A1 | 2/2013 | Seferos et al. | |
| 2014/0343532 | A1 | 11/2014 | Ross | |
| 2015/0098984 | A1 | 4/2015 | Chang et al. | |

FOREIGN PATENT DOCUMENTS

| | | |
|---|---|---|
| KR | 10-0769588 B1 | 10/2007 |
| WO | WO 2004/103893 A1 | 12/2004 |

OTHER PUBLICATIONS

Jeon et al., "The nobel nano-patterning technology for high resolution pattern (sub 20nm) by secondary sputtering phenomenon over large area", The Polymer Society of Korea, 2010, 3PS-216, vol. 35, No. 1.

Korean Notice of Allowance dated Mar. 25, 2013.

* cited by examiner

FIG. 9a
FIG. 9c
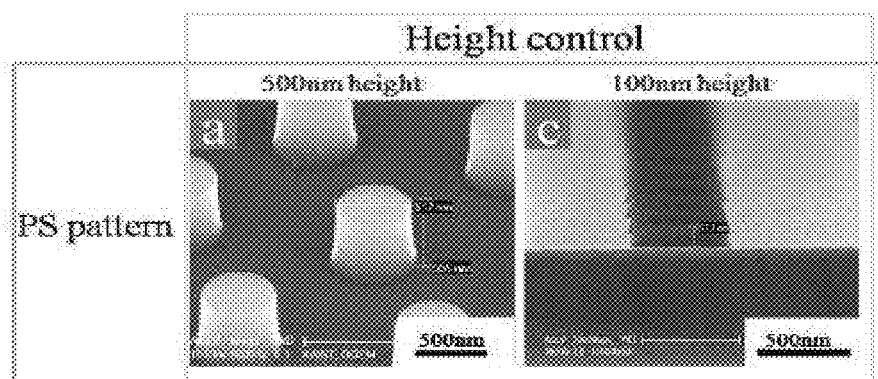
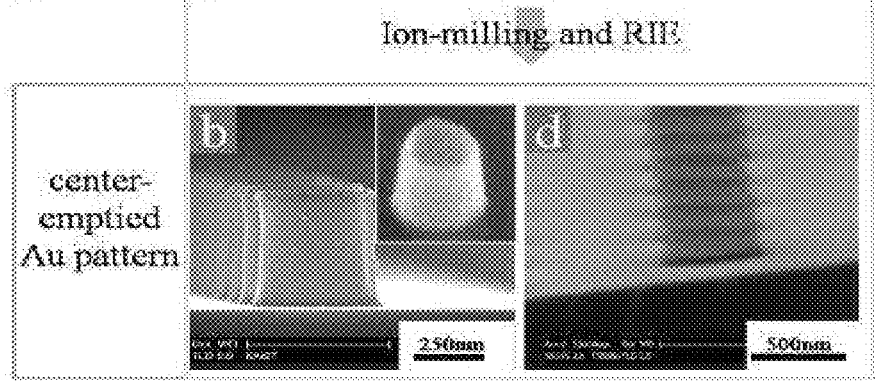
FIG. 9b
FIG. 9d

METHOD OF FABRICATING NANOSTRUCTURES USING MACRO PRE-PATTERNS

CROSS-REFERENCE TO RELATED APPLICATION

This application is a continuation-in-part of U.S. application Ser. No. 14/511,992 filed on Oct. 10, 2014, which is a divisional of U.S. application Ser. No. 13/081,276 filed on Apr. 6, 2011. This application also claims the benefit of U.S. application Ser. No. 14/511,992 filed on Oct. 10, 2014, U.S. application Ser. No. 13/081,276 filed on Apr. 6, 2011, and Korean Patent Application No. 10-2010-0062183 filed on Jun. 29, 2010 in the Korean Intellectual Property Office, the disclosures of which are expressly incorporated by reference in their entireties.

TECHNICAL FIELD

The present invention relates to a method of fabricating nanostructures using macro pre-patterns, and more particularly, to a method of fabricating nanostructures using macro pre-patterns, which comprise either depositing a target material on a substrate having macro pre-patterns formed thereon, or applying a target material to a substrate and then forming macro pre-patterns on the substrate, and then depositing the target material on the side surface of the macro pre-patterns by an ion bombardment phenomenon occurring during etching.

BACKGROUND ART

In recent years, with the tendency for increased integration and miniaturization of electronic devices, studies on nanostructure materials and fabrication methods thereof have been very actively conducted.

Particularly, it is thought that techniques for fabricating large-area nanopatterns of high resolution and high aspect ratio are necessary to achieve the high performance of future nano devices, such as nanosized electronic devices, optical devices, bio-devices and energy devices. Also, nanoimprint, e-beam, dip-pen, block copolymer and soft lithography techniques have been studied to realize high-performance nano-devices.

The dip-pen, e-beam and scanning probe microscope (SPM) lithography techniques capable of showing the highest resolution have an advantage capable of fabricating high resolution patterns on the order of tens of nanometers, but suffer from a disadvantage in that they have significantly slow processing speeds, because they involve scanning with a tip. In addition, these techniques have to use expensive equipment that limit the actual use of these techniques in research and production.

Also, the nanoimprint and soft lithography techniques capable of fabricating nanopatterns in large area within a relatively short process time have an advantage in that a pattern having the size of a mask mold can be repeatedly transferred to a large-area substrate, but suffer from limitations in that it is impossible to fabricate a pattern having a size smaller than that of the mask mold and in that it is very expensive to fabricate a mask of less than 100 nm. Moreover, in these lithography techniques, because a pattern is fabricated using a stamping or etching process, only the two-dimensional shape of the mask mold is transferred as it is, and thus it is impossible to fabricate a three-dimensional pattern. In addition, when nanostructure patterns of other sizes or shapes are to be fabricated, other mask molds should be fabricated.

Accordingly, the present inventors have made many efforts to solve the above-mentioned problems occurring in the prior art and, as a result, have found that three-dimensional nanostructures of various shapes having high aspect ratio and uniformity can be fabricated by depositing a target material on a substrate having macro pre-patterns formed thereon, or applying a target material to a substrate and then forming macro pre-patterns on the substrate, and then depositing the target material on the side surface of the macro pre-patterns by an ion bombardment phenomenon occurring during etching, thereby completing nanostructures of various shapes having high aspect ratio and uniformity according to the present invention.

DISCLOSURE OF INVENTION

It is a main object of the present invention to provide nanostructures of various shapes having high aspect ratio and uniformity and a fabrication method thereof.

To achieve the above object, the present invention provides a method for fabricating nanostructures using macro pre-patterns comprising: (a) depositing a target material on a substrate having macro pre-patterns formed thereon; and (b) depositing the target material on the side surface of the macro pre-patterns by etching, thereby fabricating nanostructures.

The present invention also provides a method of fabricating nanostructures using macro pre-patterns comprising: (a) depositing a target material on a substrate and forming a macro pre-pattern; and (b) depositing the target material on the side surface of the macro pre-patterns by etching, thereby fabricating nanostructures.

The present invention also provides a method of fabricating straight line-shaped nanostructures using macro pre-patterns, the method comprising the steps of: (a) depositing a first target material on a substrate having formed thereon first macro pre-patterns; (b) depositing the first target material on the side surface of the first macro pre-patterns by etching, thereby fabricating first nanostructures; (c) depositing a second target material on the substrate having the first nanostructures formed thereon; and d) depositing the second target material on the side surface of second macro pre-patterns by etching, thereby fabricating second nanostructures.

The present invention also provides a method of fabricating straight line-shaped nanostructures using macro pre-patterns, the method comprising the steps of: (a) applying a first target material to a substrate, and then forming first macro pre-patterns on the substrate; (b) depositing the first target material on the side surface of the first macro pre-patterns by etching, thereby fabricating first nanostructures; (c) applying a second target material on the substrate having the first nanostructures formed thereon, and then forming second macro pre-patterns on the substrate; and (d) depositing the second target material on the side surface of the macro pre-patterns by etching, thereby fabricating second nanostructure.

The present invention also provides a method of fabricating lattice-shaped nanostructures using macro pre-patterns, the method comprising the steps of: (a) depositing a first target material on a substrate having first macro pre-patterns formed thereon; (b) depositing the first target material on the side surface of the first macro pre-patterns by etching; (c) forming second pre-patterns on the substrate, which has the first nanostructures formed thereon, at an angle different from that of the first nanostructures, and then depositing a second target on the substrate; and (d) depositing the second target material on the side surface of the second macro pre-patterns by etching.

The present invention also provides a method of fabricating lattice-shaped nanostructures using macro pre-patterns, the method comprising the steps of: (a) applying a first target material to a substrate, and then forming first pre-patterns on the substrate; (b) depositing the first target material on the side surface of the first macro pre-patterns by etching, thereby fabricating first nanostructures; (c) applying a second target material to the substrate at an angle different from that of the first nanostructures, and then forming second pre-patterns on the substrate; and (d) depositing the second target material on the side surface of the second macro pre-patterns by etching, thereby fabricating second nanostructures.

BRIEF DESCRIPTION OF THE DRAWINGS

The above and other objects, features and advantages of the present invention will be more clearly understood from the following detailed description taken in conjunction with the accompanying drawing, in which:

FIG. 9a-9d show scanning electron micrographs of three-dimensional nanostructures fabricated according to another embodiment of the present invention (a: PS structures having a 520-nm height; b: three-dimensional gold nanostructures having a 500-nm height; c: PS structures having a 120-nm height; and d: three-dimensional gold nanostructures having a 100-nm height).

EXPLANATION ON REFERENCE NUMERALS OF MAIN ELEMENTS

Figure 1A:
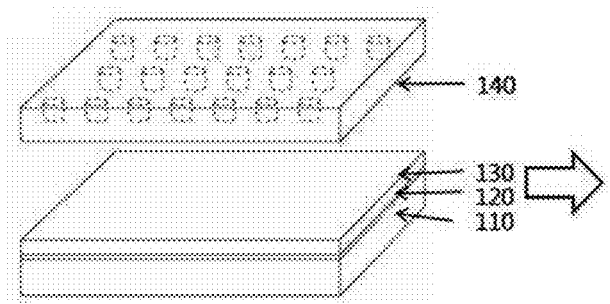
FIGS. 1a-1e show a process for fabricating three-dimensional nanostructures according to one embodiment of the present invention.
Figure 1B:
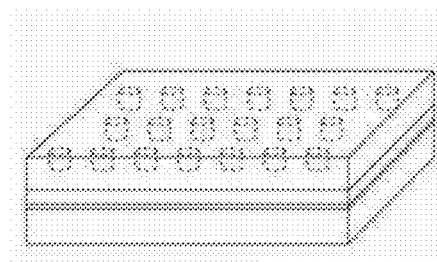

110: substrate 120: target material layer
125: target material 130: pre-pattern layer
135: pre-pattern 140: nanoimprint mold
150: target material-pre-pattern composite structures
200: nanostructures

BEST MODE FOR CARRYING OUT THE INVENTION

The present inventors have found that three-dimensional nanostructures of various shapes having a high aspect ratio and high uniformity can be fabricated by either depositing a target material on a substrate having macro pre-patterns formed thereon, or applying a target material to a substrate and then forming macro pre-patterns on the substrate, and then depositing the target material on the side surface of the macro pre-patterns by an ion bombardment phenomenon occurring etching.

Therefore, in one aspect, the present invention is directed to a method of fabricating nanostructures using macro pre-patterns, the method comprising the steps of: (a) depositing a target material on a substrate having macro pre-patterns formed thereon; and (b) depositing the target material on the side surface of the macro pre-patterns by an ion embodiment phenomenon occurring through etching, thereby fabricating nanostructures.

The key idea of the present invention is to use an ion bombardment phenomenon in which particles of a physically bombarded target material are scattered in all directions. According to the present invention, three-dimensional nanostructures with high aspect ratio and uniformity are fabricated in large area by providing patterned pre-pattern structures having an outer surface to which target material particles scattered from a target material layer can be attached, and then removing only the pre-pattern from target material-pre-pattern composite structures formed as a result of a process in which the particles scattered from the target material by the ion bombardment phenomenon are attached to pre-pattern structures.

An embodiment of the present invention is directed to a method for fabricating nanostructures, comprising the steps of: (a) forming a target material layer and a pre-pattern layer sequentially on a substrate; (b) performing a lithography process on the pre-pattern layer to form pre-patterned structures; (c) ion-etching the target material layer to form target material/pre-pattern composite structures including the ion-etched target material attached to the outer surface of the pre-patterned structures; and (d) removing the pre-patterns from the target material/pre-pattern composite structures, thereby fabricating nanostructures.

FIG. 1 and FIG. 2 show a method for fabricating nanostructures according to the present invention. As shown therein, a target material and pre-patterns are sequentially applied to a substrate 110 to form a target material layer 120 and a pre-pattern layer 130 on the substrate 110 (FIG. 1a).

The nanostructure fabrication method according to the present invention may further comprise step (c) of removing the macro pre-patterns.

In addition, the nanostructure fabrication method according to the present invention may further comprise, after step (c) of removing the macro pre-patterns, a step of forming a pattern protective layer.

In addition, in the present invention, the macro pre-patterns may be formed by depositing the pre-pattern material on the substrate and performing a lithography or imprinting process on the deposited pre-pattern material.

The substrate 110 may be made of any material that enables formation of pre-patterns. Preferably, the substrate 110 may be a transparent substrate made of a polymer material such as polyethyleneterephthalate (PET), polyarylate (PAR), or polyethylene (PE), or may be a substrate made of a material selected from the group consisting of quartz, glass, silicon, silicon oxide, and mixtures thereof. Preferably, the substrate 110 that is used in the present invention is a transparent glass substrate.

The target material may be used without any limitation as long as it is a material that can be scattered in all directions through application of energy by the ion bombardment phenomenon occurring during physical ion etching. Preferably, the target material may be selected from a metallic conductive material such as gold, platinum, silver, copper, aluminum, nickel, iron, titanium, molybdenum or chromium, and a non-metallic material such as zinc oxide, silicon, silicon dioxide, indium tin oxide (ITO) or titanium oxide.

The etching may be performed by a milling or sputtering process. The milling process, preferably an ion milling process, is performed under a vacuum of about $10^{-6}$ Torr, and the time of the milling process is controlled depending on the thickness of the deposited target material in order to ensure transparency. The degree of vacuum and time required for the milling process may be controlled to be inversely proportional to each other, and may be controlled depending on the intensity of ion beams. If the intensity of ion beams is too high, deposition on the side surface of the pre-patterns according to the present invention will not be achieved, and only a general milling effect will occur.

A material that is used for the pre-patterns may be any material that can be fabricated into structures by a process such as lithograph or imprinting. Preferably, the material that can be used for the pre-patterns may be selected from the group consisting of polystyrene, chitosan, polyvinyl alcohol, polymethylmethacrylate (PMMA), and photoresist (PR).

In the present invention, in the process of forming the target material layer 120 and the pre-pattern layer 130 sequentially on the substrate 110, the target material layer 120 is generally formed by a process selected from the group consisting of chemical vapor deposition (CVD), atomic layer deposition, sputtering, laser ablation, arc discharge, plasma deposition, thermal chemical vapor deposition and e-beam evaporation processes, and the pre-pattern layer 130 is formed by spin coating or spray coating.

In the present invention, the target material layer 120 may be formed to have a multilayer structure depending on the intended use or the like of the nanostructures that are final products.

Figure 1D:
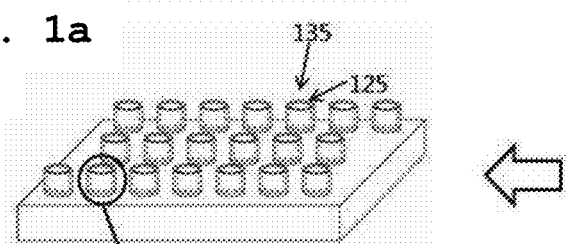
Figure 1C:
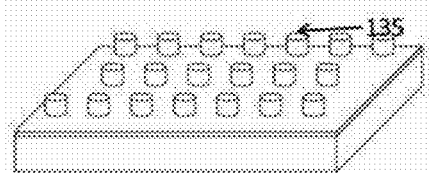
Figure 2A:
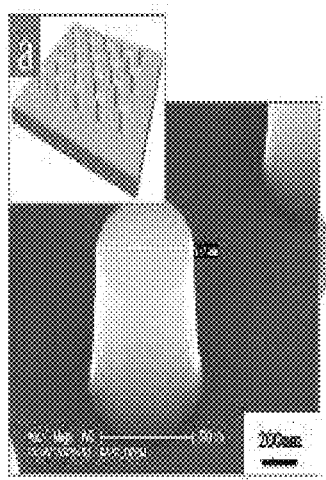
FIGS. 2a-2c depict scanning electron micrographs of three-dimensional nanostructures fabricated according to one embodiment of the present invention.

The pre-pattern layer 130 formed on the target material layer 120 as described above is patterned by a lithography process (FIG. 1b) using a nanoimprint mold 140, thereby forming patterned pre-pattern structures 135 (FIGS. 1c and 2a). Because the shape of the formed structures 135 determines the shape of nanostructures to be fabricated, nanostructures 200 of various shapes can be easily fabricated by controlling the shape of the structures 135 using various lithography processes.

The lithography process that is used in the present invention may be a conventional lithography process. Preferably, it is carried out by at least one process selected from the group consisting of nanoimprint lithography, soft lithography, block copolymer lithography, light lithography and capillary lithography.

Particularly, pre-patterned structures obtained by patterning using a lithography process can further be controlled to have various shapes and sizes depending on reactive ion etching (RIE) conditions and the pre-pattern layer around the pre-patterned structures. For example, in reactive ion etching under a high vacuum of 0.001-0.01 Torr, only isotropic etching (i.e., etching of the bottom) is possible, but in reactive ion etching under a low vacuum of 0.1-0.6 Torr, isotropic etching (i.e., etching in all directions) progresses. For this reason, when the pre-patterned structures are additionally ion-etched under a low vacuum, the overall height and diameter of the pre-patterned structures decrease. Thus, when relative ion etching is additionally performed in a state in which only the pre-patterned structures remains after the pre-pattern layer around the pre-patterned structures was completely removed, the bottom of the pre-patterned structures is relatively more etched, and thus three-dimensional cup-shaped pre-pattern structures having a deep bottom portion are formed. As the ion etching time increases, pre-patterned structures having a deeper bottom portion can be formed.

Furthermore, the size of the pre-patterned structures can be controlled depending on the thickness of the pre-pattern layer applied to the substrate. If the thickness of the pre-pattern layer is thin, the pre-pattern layer will be removed within a short reactive ion etching time, and only the pre-patterned structures will remain, indicating that cup-shaped pre-patterned structures will be formed within a short time, but if the thickness of the pre-pattern layer is thick, reactive ion etching will be performed for a long time, and thus the pre-patterned structures will be entirely etched so that the entire size of the pre-patterned structures will decrease, indicating that the pre-patterned structures will have a small diameter.

Figure 2B:
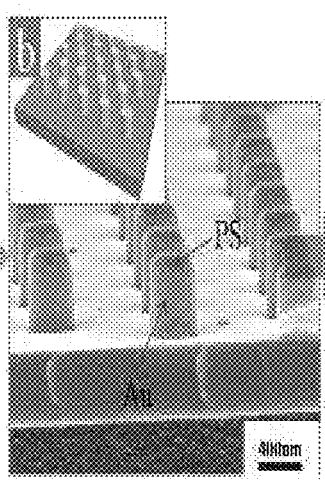

In the present invention, target material-pre-pattern composite structures 150 are formed by attaching particles of a target material 125 to the outer surface of the pre-pattern structures 135, formed as described above, using an ion bombardment phenomenon occurring during physical ion etching of the target material (FIGS. 1d and 2b).

Figure 3:
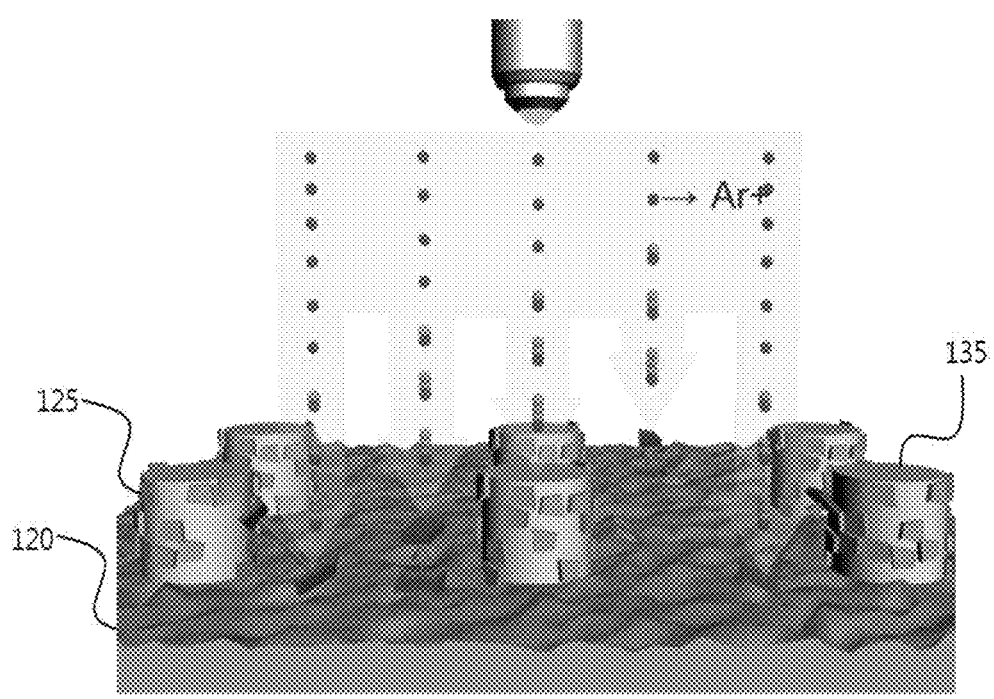
FIG. 3 is a schematic view showing an ion etching process according to the present invention.

As shown in FIG. 3, the ion bombardment phenomenon refers to a phenomenon in which, when ions (e.g., argon ions) accelerated by a voltage difference are physically bombarded onto the target material layer 120, particles of the bombarded target material 125 are scattered in the crystal direction due to high-energy bombardment.

In the present invention, the etching process for creating the ion bombardment phenomenon can be performed by milling or sputtering. Herein, milling can be performed by forming plasma using a gas under a process pressure of 0.001-10 mTorr, and then accelerating the plasma to 100-700 V. The gas may be selected from the group consisting of argon, helium, nitrogen, oxygen, and mixtures thereof, but is not limited thereto.

Where the ion bombardment phenomenon is created by applying high energy to small ions, the wide angle distribution of the polycrystalline orientation becomes narrower to reduce the angle at which the particles are scattered, thus making it difficult to attach the particles of the target material 125 to the outer surface of the patterned pre-pattern structures 135. For this reason, the physical ion etching process is preferably carried out by forming plasma using a heavy gas such as argon under a process pressure of 0.1-10 mTorr, and then accelerating the plasma to 200-1,000 eV.

In the physical etching process, if ion etching is carried out using plasma accelerated to more than 1,000 eV, particles will be scattered from the target material layer in the vertical direction equal to the ion incidence direction, and thus the amount of particles attached to the outer surface of the pre-pattern structures will be small. On the other hand, if ion etching is carried out using plasma accelerated to less than 200 eV, the etching rate of the target material layer will be low, and thus the operating efficiency will be deteriorated.

In the present invention, the heavy gas is selected from the group consisting of argon, helium, nitrogen, hydrogen, oxygen, and mixtures thereof. Preferably, it is argon.

Figure 1E:
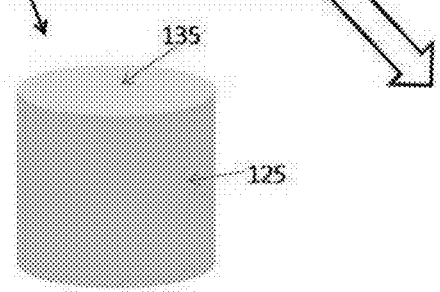
Figure 2C:
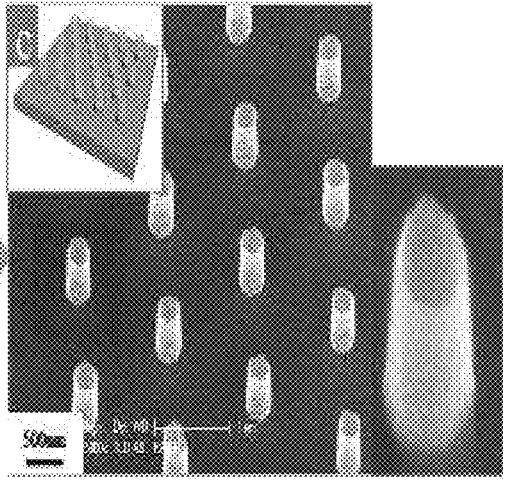

The target material-pre-pattern composite structures 150 formed as described above are dry-etched or wet-etched to remove the pre-pattern 135, thereby fabricating nanostructures 200 (FIGS. 1e and 2c). The dry etching or wet etching is carried out by a conventional etching process capable of removing the pre-pattern.

In the method for fabricating three-dimensional nanostructures according to the present invention, only desired patterned three-dimensional nanostructures can be fabricated by fabricating the three-dimensional nanostructures 200, and then removing an unnecessary target material portion from the fabricated three-dimensional nanostructures 200 by ion etching.

In the method for fabricating three-dimensional nanostructures according to the present invention, three-dimensional nanostructures with high aspect ratio and uniformity can be fabricated in large area by a simple process at low cost by using the ion bombardment phenomenon occurring during physical ion etching. Also, various structures can be easily fabricated by controlling the pattern of the pre-pattern structures, and uniform fine nanostructures having a thickness of 10 nm or less can be formed in a large area.

Because the present invention is directed to a method in which a panel material is deposited on the wall surface of pre-patterns, the final shape is determined according to the shape of the pre-patterns. Patterns having various shapes can be fabricated by changing the shape of the pre-patterns. For example, the shape may be a line shape, a lattice shape, a square column shape, or a "⌐" shape. Patterns having a lattice shape can be obtained by repeating the process shown in FIG. 1 twice. When pre-patterns spaced at a distance equal to or smaller than the thickness of the transparent electrodes to be formed between pre-pattern modules having a square column shape by ion milling are formed and a panel material is ion-milled, the transparent electrodes can be connected to each other in a mesh topology.

In another aspect, the present invention is directed to a method of fabricating nanostructures using macro pre-patterns, the method comprising the steps of: (a) applying a target material to a substrate, and then forming macro pre-patterns on the substrate; and (b) depositing the target material on the side surface of the macro pre-patterns by an ion bombardment phenomenon occurring during etching, thereby fabricating nanostructures.

In another aspect, the present invention is directed to a method for fabricating three-dimensional nanostructures, the method including the steps of: (a) forming a pre-pattern layer on a substrate, and patterning the formed pre-pattern layer by a lithography process to form patterned pre-pattern structures; (b) forming a target material layer on the substrate having the patterned pre-pattern structures formed thereon; (c) ion-etching the target material layer to form target material-pre-pattern composite structures including the ion-etched target material attached to the outer surface of the pre-pattern structures; and (d) removing the pre-pattern from the target material-pre-pattern composite structures, thereby fabricating three-dimensional nanostructures.

Figure 4A:
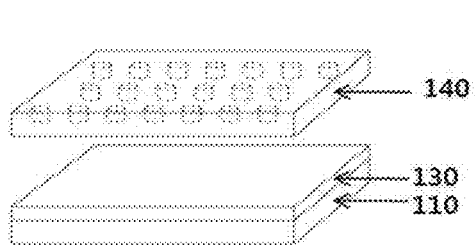
FIG. 4a-4e show a process for fabricating three-dimensional nanostructures according to another embodiment of the present invention.
Figure 4B:
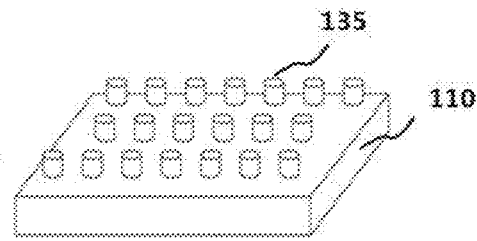
Figure 4D:
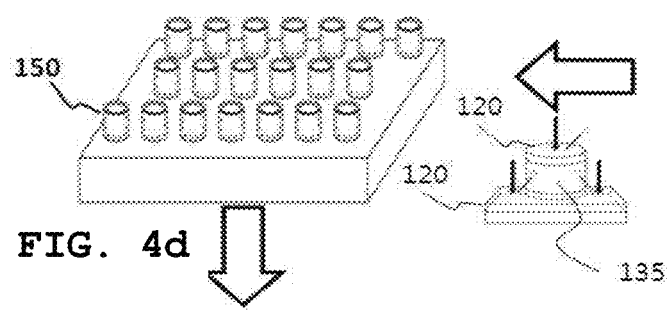
Figure 4C:
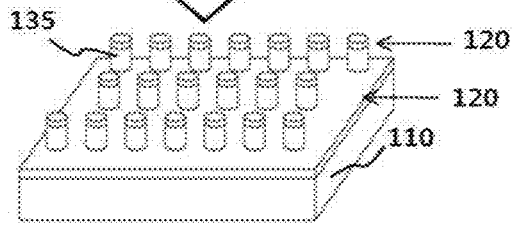
Figure 4E:
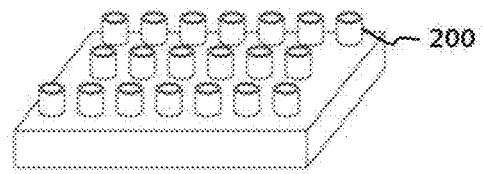

As shown in FIG. 4, the method for manufacturing three-dimensional nanostructures according to the present invention comprises applying a pre-pattern layer 130 to a substrate 110 (FIG. 4a), and then forming patterned pre-pattern structures 135 by a lithography process (FIG. 4b). A target material layer 120 is formed on the substrate having the patterned pre-pattern structures 135 formed thereon (FIG. 4c), and the formed target material layer 120 is physically ion-etched so that the target material particles are attached to the outer surface of the pre-pattern structures 135 by the ion bombardment phenomenon, thereby forming target material-pre-pattern structures 150 (FIG. 4d). Only the pre-pattern 135 is removed from the formed target material-pre-pattern structures 150, thereby fabricating three-dimensional nanostructures (FIG. 4e).

In this fabrication method, there is an advantage in that it is not required to perform a step of removing a target material 125 from three-dimensional nanostructures 200, after fabrication of the three-dimensional nanostructures 200.

In the present invention, the fabrication method may comprise step (d) of rotating the nanostructures, obtained in step (c), at an angle of 0.1-90°, and repeating steps (a) to (c) 2-5 times.

In another aspect, the present invention provides a method of fabricating straight line-shaped nanostructures using macro pre-patterns, the method comprising the steps of: (a) depositing a first target material on a substrate having first macro pre-patterns formed thereon; (b) depositing the first target material on the side surface of the first macro pre-patterns by an ion bombardment phenomenon occurring during etching, thereby fabricating first nanostructures; (c) depositing a second target material on the substrate having the first nanostructures formed thereon; and d) depositing the second target material on the side surface of second macro pre-patterns by an ion bombardment phenomenon occurring during etching, thereby fabricating second nanostructures.

In still another aspect, the present invention provides a method of fabricating straight line-shaped nanostructures using macro pre-patterns, the method comprising the steps of: (a) applying a first target material to a substrate, and then forming first macro pre-patterns on the substrate; (b) depositing the first target material on the side surface of the first macro pre-patterns by an ion bombardment phenomenon occurring during etching, thereby fabricating first nanostructures; (c) applying a second target material on the substrate having the first nanostructures formed thereon, and then forming second macro pre-patterns on the substrate; and (d) depositing the second target material on the side surface of the macro pre-patterns by an ion bombardment phenomenon occurring during etching, thereby fabricating second nanostructure.

In still another aspect, the present invention provides a method of fabricating lattice-shaped nanostructures using macro pre-patterns, the method comprising the steps of: (a) depositing a first target material on a substrate having first macro pre-patterns formed thereon; (b) depositing the first target material on the side surface of the first macro pre-patterns by an ion bombardment phenomenon occurring during etching; (c) forming second pre-patterns on the substrate, which has the first nanostructures formed thereon, at an angle different from that of the first nanostructures, and then depositing a second target on the substrate; and (d) depositing the second target material on the side surface of the second macro pre-patterns by an ion bombardment phenomenon occurring during etching.

In still another aspect, the present invention provides a method of fabricating lattice-shaped nanostructures using macro pre-patterns, the method comprising the steps of: (a) applying a first target material to a substrate, and then forming first pre-patterns on the substrate; (b) depositing the first target material on the side surface of the first macro pre-patterns by an ion bombardment phenomenon occurring during etching, thereby fabricating first nanostructures; (c) applying a second target material to the substrate at an angle different from that of the first nanostructures, and then forming second pre-patterns on the substrate; and (d) depositing the second target material on the side surface of the second macro pre-patterns by an ion bombardment phenomenon occurring during etching, thereby fabricating second nanostructures.

In the present invention, the first nanostructures or the second nanostructures can be fabricated by depositing the target material on the side surface of the macro pre-patterns by an ion bombardment phenomenon occurring during etching.

Figure 5:
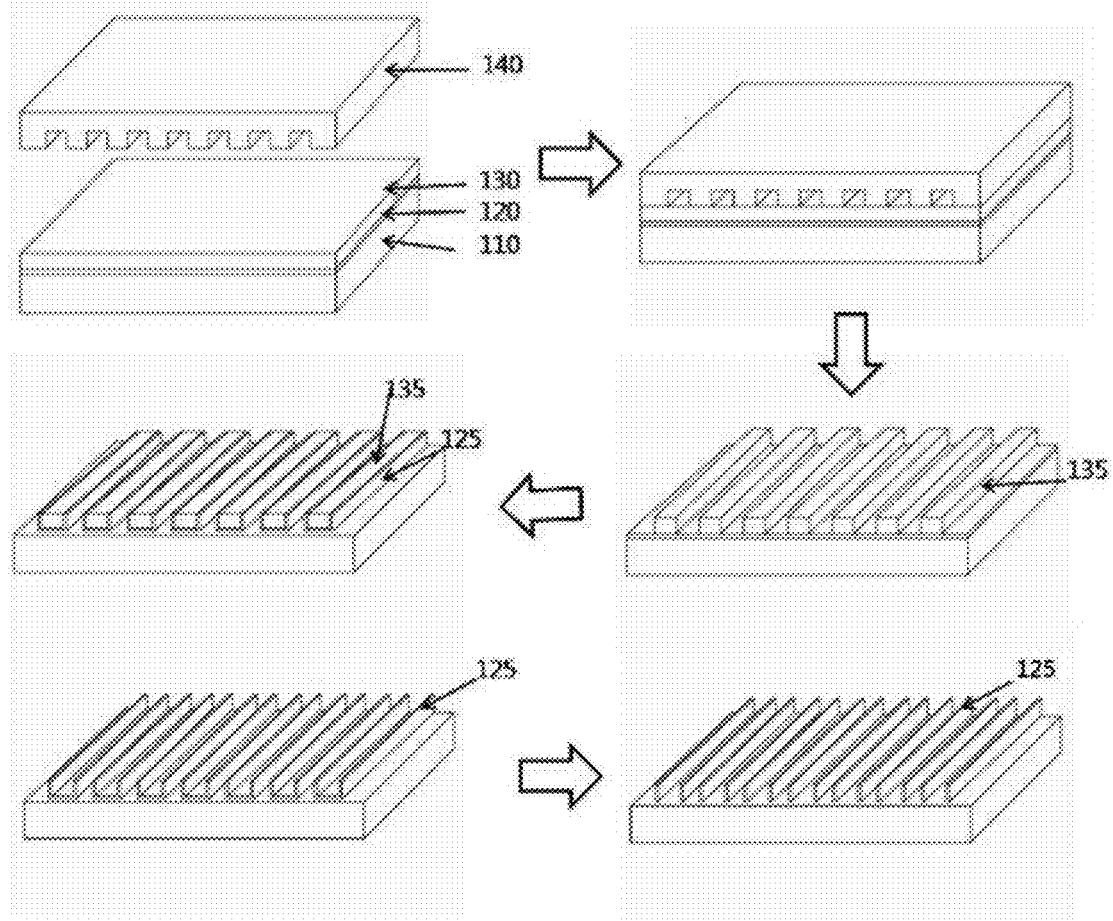
FIG. 5 shows a process for fabricating three-dimensional nanostructures of rectangular parallelepiped shape according to the present invention.

The straight-line shaped patterns and the lattice-shaped patterns (see FIG. 12) can be obtained when the process as shown in FIG. 5 is repeated in a state in which the angle of the patterns is not changed or is changed. The difference in height between the partitions of the lattice shown in FIG. 12 can be obtained by controlling the height of the pre-patterns in the repeated process. The height of the pre-patterns can be controlled by using imprinting molds having different heights or changing the height of pre-pattern material deposited.

The patterns may have an angle of 70-90°, preferably 80-90°, more preferably 85-90°.

Herein, the first nanostructures and the second nanostructures may have an angle of 0.1-90° with respect to each other.

The method of the present invention may further comprise either a step of removing the first macro pre-patterns after step (b) of depositing the first target material, or a step of removing the second macro pre-patterns after step (d) of depositing the second target material.

In the present invention, the first nanostructure and the second nanostructure may form one selected from the group consisting of a touch screen panel, a polarizing panel, and a security panel. Preferably, one of the first nanostructure and the second nanostructure may form a touch screen panel, and the other may form one selected from the group consisting of a polarizing panel, a touch screen panel, and a security panel.

In yet another aspect, the present invention is also directed to three-dimensional nanostructures which are fabricated by said method and have a shape selected from the group consisting of a cylindrical shape, an inverse conical shape, a line shape, a "⌐" shape, a rectangular parallelepiped shape, a top shape, a cup shape, a lattice shape, and a square pillar shape. The three-dimensional nanostructures contain a polycrystalline material in which the ion bombardment phenomenon occurs well and have an aspect ratio of 50 or less. The nanostructures may have a line width ranging from 1 nm to 100 μm and a height ranging from 10 nm to 1000 μm, and the spacing between the pre-pattern modules may be 1-100 μm.

According to the method for fabricating three-dimensional nanostructures according to the present invention, three-dimensional nanostructures having a height of 500 nm or more can be formed uniformly over a large area by ion-etching a target material layer having a small thickness ranging from 20 nm to 30 nm, and thus the surface area of the nanostructures can be increased. In addition, the height of the nanostructures can be easily controlled by additional etching, and thus the increase in surface area of the nanostructures can also be controlled. Additionally, because the nanostructures have a high aspect ratio, the present invention can be used in a wide range of studies on patterns having a high aspect ratio.

The three-dimensional structures according to the present invention are fabricated using the ion bombardment phenomenon in which particles of the physically bombarded target material are scattered in all directions. Namely, the three-dimensional structures are fabricated by providing patterned pre-pattern structures to which target material particles scattered by the ion bombardment phenomenon can be attached, and then removing the pre-pattern to which the target material particles had been attached. Thus, the shape of the nanostructures can be easily controlled according to the shape of the outer surface of the pre-pattern structures, and the nanostructures having high aspect ratio and uniformity are formed in a large area.

Hereinafter, the present invention will be described in further detail with reference to examples. It will be obvious to a person of ordinary skill in the art that these examples are illustrative purposes only and are not to be construed to limit the scope of the present invention.

Example 1

Fabrication of Three-Dimensional Nanostructures of Cylindrical Shape 1-1: Formation of Pre-Pattern Structures Gold was deposited on a glass substrate to a thickness of 15 nm by e-beam evaporation, 20 and then a polystyrene (3 wt %)/toluene mixture was spin-coated thereon, after which the toluene was evaporated to form a polystyrene layer having a 135-nm thickness. The formed polystyrene layer was patterned using a nanoimprint mold having depressions of cylindrical shape at 135° C. in a vacuum under capillary force for 1 hour, whereby polystyrene patterns of cylindrical shape having an outer diameter of 500 nm, a height of 550 nm and an interval between polymer structures of 900 nm were formed in an area of 7 mm×7 mm. Then, the nanoimprint mold was detached, and the remaining structures were cooled, thereby forming patterned polystyrene structures. The polystyrene layer excluding the formed polystyrene structures was removed by reactive ion etching using a mixed gas of oxygen and tetrafluoromethane (40:60), whereby polystyrene structures having an outer diameter of 400 nm, a height of 500 nm and an interval between structures of 1000 nm were formed on the glass substrate (FIG. 2a).

1-2: Formation of Target Material-Pre-Pattern Composite Structures

The gold layer on which the patterned polystyrene structures had been formed as described in Example 1-1 above was ion-etched in an ion milling system (VTS Co., Ltd., Korea) using plasma, formed from argon gas, under a pressure of 0.1 mTorr at 500 eV, thereby forming gold-polystyrene composite structures including gold particles attached to the outer surface of the polystyrene structures (FIG. 2b).

1-3: Fabrication of Three-Dimensional Nanostructures

The gold-polystyrene composite structures formed in Example 1-2 above were reactive-ion etched under an oxygen atmosphere and sonicated in a dichloromethane solution to remove the polystyrene, thereby fabricating three-dimensional gold nanostructures of hollow cylindrical shape having an outer diameter of 400 nm, an inner diameter of 385 nm, a thickness of 15 nm and a height of 500 nm (FIG. 2c).

Example 2

Figure 6A:
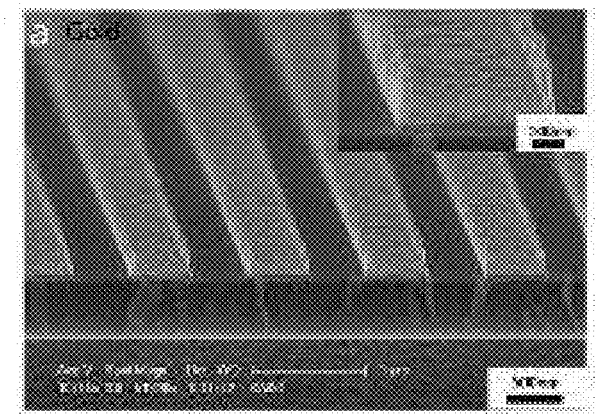
FIG. 6a-6d depict scanning electron micrographs of three-dimensional nanostructures of rectangular parallelepiped shape according to the present invention (a: three-dimensional gold nanostructures; b: three-dimensional platinum structures; c: three-dimensional zinc oxide nanostructures; and d: three-dimensional aluminum nanostructures)
Figure 6B:
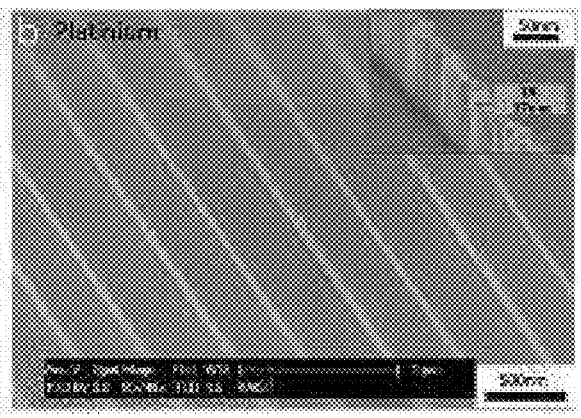
Figure 6C:
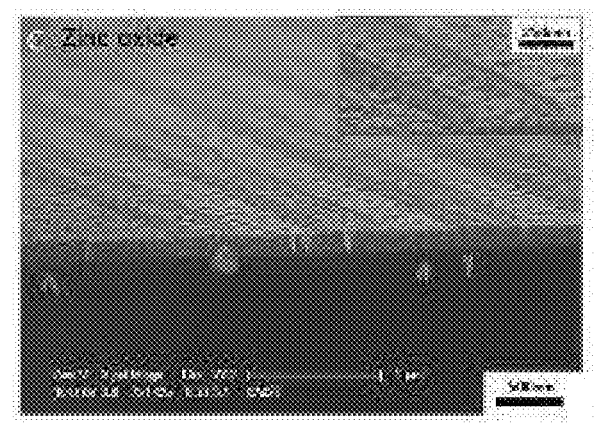
Figure 6D:
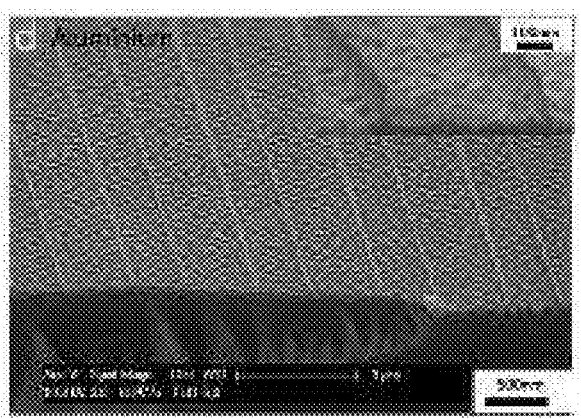

Fabrication of Three-Dimensional Nanostructures of Rectangular Parallelepiped Shape/Line Shape According to the same method as described in Example 1, three-dimensional gold nanostructures of "⊏" shape having a size of 5 mm (length)×250 nm (height)×500 nm (width) and a thickness of 15 nm (FIG. 6a), three-dimensional platinum nanostructures of "⊏" shape having a size of 5 mm (length)×150 nm (height)×500 nm (width) and a thickness of 15 nm (6b), three-dimensional zinc oxide nanostructures of "⊏" shape having a size of 5 mm (length)×85 nm (height)× 500 nm (width) and a thickness of 15 nm, and three-dimensional nanostructures of "⊏" shape having a size of 5 mm (length)×100 nm (height)×500 nm (width) and a thickness of 15 nm were fabricated using a nanoimprint mold, having depressions of rectangular parallelepiped shape as shown in FIG. 5, and using gold, platinum, zinc oxide or aluminum as a target material. In addition, the three-dimensional zinc oxide nanostructures and the three dimensional aluminum nanostructures were further treated by ion milling, thereby fabricating three-dimensional zinc oxide nanostructures of line shape having a size of 5 mm (length)×85 nm (height)×500 nm (width) and a thickness of 15 nm (FIG. 6c), and three-dimensional aluminum nanostructures having a size of 5 mm (length)×100 nm (height)×500 nm (width) and a thickness of 15 nm (FIG. 6d).

Example 3

Fabrication of Three-Dimensional Nanostructures of Top Shape

Figure 7A:
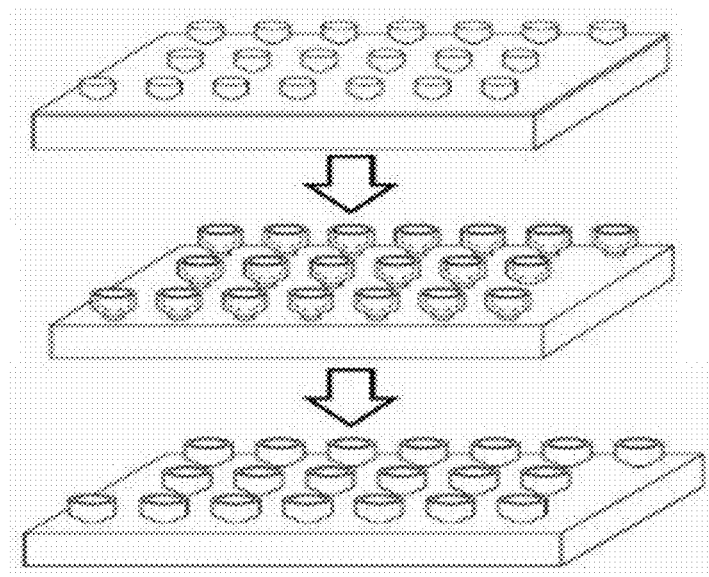
FIG. 7a-7b show a process for fabricating three-dimensional nanostructures of top shape according to the present invention (a) and a scanning electron micrograph of the three dimensional nanostructures of top shape (b)

According to the same method as described in Example 1, patterned polystyrene structures were formed using a nanoimprint mold having depressions of cylindrical shape as shown in FIG. 2. The lower portion of the patterned polystyrene structures was over-etched by reactive ion etching using a mixed gas of oxygen and tetrafluoromethane (40:60) under a low vacuum of 0.1 Torr, after which three-dimensional gold nanostructures of top shape were fabricated using the polystyrene structures (FIG. 7a).

Figure 7B:
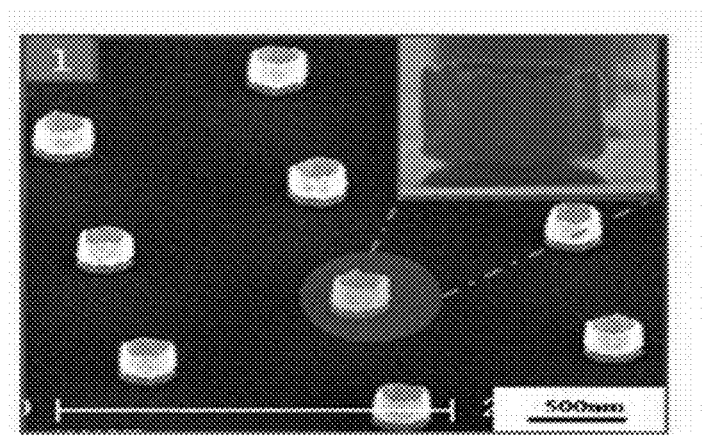

As a result, as can be seen in FIG. 7b, three-dimensional gold nanostructures of hollow top shape having a maximum outer diameter of 300 nm, a minimum outer diameter of 250 nm and a height of 200 nm were fabricated.

Example 4

Fabrication of Three-Dimensional Nanostructures of Inverse Conical Shape

Figure 8A:
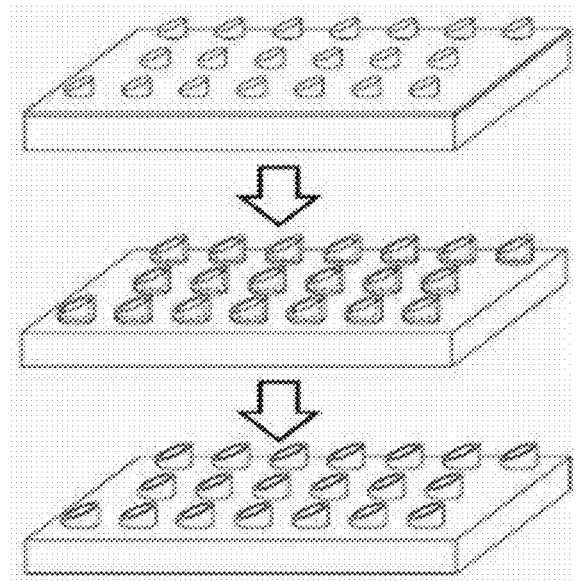
FIG. 8a-8b show a process for fabricating three-dimensional nanostructures of conical shape according to the present invention (a) and a scanning electron micrograph of the three dimensional nanostructures of conical shape (b)

According to the same method as described in Example 1, patterned polystyrene structures were formed using a nanoimprint mold having depressions of inverse conical shape, after which three-dimensional gold nanostructures of hollow inverse conical shape were formed using the polystyrene structures (FIG. 8a).

Figure 8B:
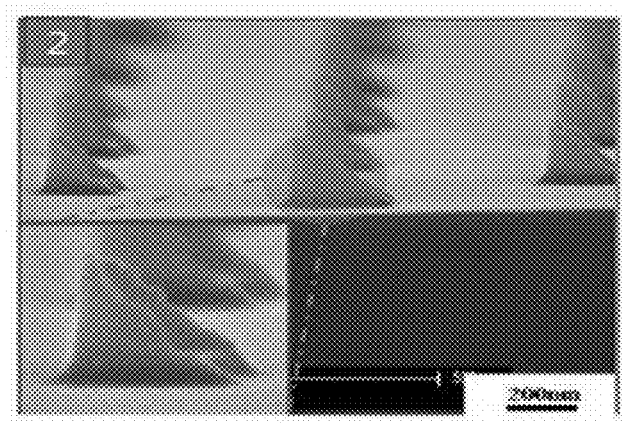
Figure 10:
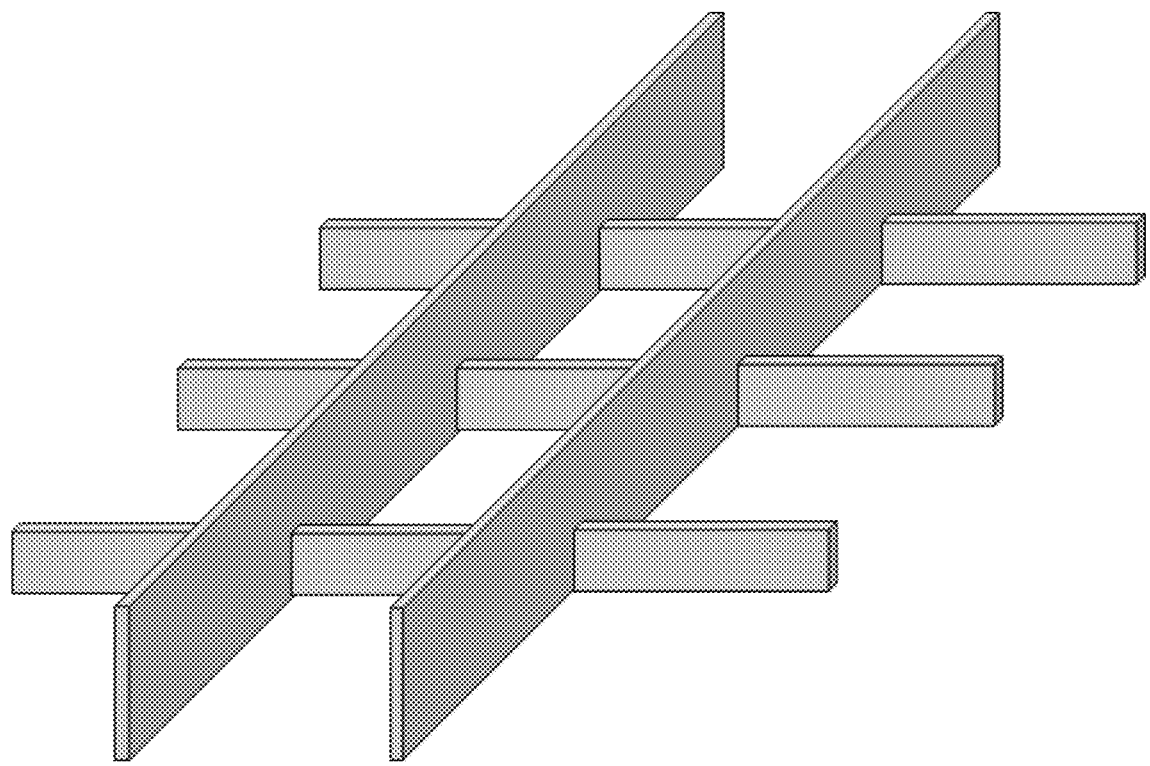
FIG. 10 is a schematic view showing a straight lattice-shaped nanostructure according to the present invention.

As a result, as can be seen in FIG. 8b, three-dimensional gold nanostructures of hollow conical shape having an outer diameter of 250 nm and a height of 150 nm were fabricated.

Example 5

Fabrication of Nanostructures According to Another Embodiment 2-1: Formation of Pre-Pattern Structures A polystyrene/toluene mixture was spin-coated on a glass substrate, and then the toluene was evaporated, thus forming a polystyrene layer having a thickness of 135 nm. The formed polystyrene layer was patterned using a nanoimprint mold, having depressions of cylindrical shape, at 135 □ under capillary force for 1 hour in a vacuum. Then, the nanoimprint mold was detached, and the remaining structures were cooled, thereby forming patterned polystyrene structures.

2-2: Formation of Target Material-Pre-Pattern Composite Structures

On the glass substrate having the polystyrene structures formed thereon as described in Example 2-1 above, gold was deposited to a thickness of 15 nm by e-beam evaporation, thereby forming a gold layer on the polystyrene structures. The gold layer was ion-etched in an ion milling system (VTS Co., Ltd., USA) using plasma, formed from argon gas, under a pressure of 0.1 mTorr at 500 eV, thereby forming gold-polystyrene composite structures including gold particles attached to the outer surface of the polystyrene structures.

3-3: Fabrication of Three-Dimensional Nanostructures

The gold-polystyrene composite structures fabricated in Example 2-2 above were subjected to reactive ion etching under an oxygen atmosphere, and then sonicated in a dichloromethane solution to remove the polystyrene, thereby fabricating three-dimensional nanostructures of hollow cylindrical shape having an outer diameter of 400 nm, an inner diameter of 385 nm and a height of 500 nm.

Example 6

Fabrication of Nanostructures According to Another Embodiment

According to the same method as described in Example 1, patterned polystyrene structures of cylindrical shape having a height of 500 nm were fabricated (FIG. 9a), after which three-dimensional gold nanostructures having a height of 500 nm were fabricated using the patterned polystyrene structures (FIG. 9b).

Also, the patterned polystyrene structures having a height of 500 nm (FIG. 9a) were reactive-ion-etched with a mixed gas of oxygen and tetrafluoromethane (40:60) under a high vacuum (0.001 Torr) for 2 minutes to form patterned polystyrene structures of cylindrical shape having a height of 100 nm (FIG. 9c), after which three-dimensional gold nanostructures having a height of 100 nm (FIG. 9d) were fabricated according to the same method as Example 1 using the patterned polystyrene structures.

As a result, it could be seen that the pattern height of the target material could be controlled by controlling the height of the pre-pattern structures.

Although the present invention has been described in detail with reference to the specific features, it will be apparent to those skilled in the art that this description is only for a preferred embodiment and does not limit the scope of the present invention. Thus, the substantial scope of the present invention will be defined by the appended claims and equivalents thereof.

INDUSTRIAL APPLICABILITY

As described above, according to the method of the present invention, three-dimensional nanostructures with high aspect ratio and uniformity can be fabricated by a simple process at low cost by using the ion bombardment phenomenon occurring during physical ion etching. Also, nanostructures of various shapes can be easily fabricated by controlling the pattern and shape of polymer structures. In addition, uniform fine nanostructures having a thickness of 10 nm or less can be formed in a large area. Accordingly, the present invention can achieve the high performance of future nano-devices, such as nanosized electronic devices, optical devices, bio devices and energy devices.

What is claimed is:

1. A method for fabricating three-dimensional nanostructures of a target material using macro pre-patterns, the method essentially consisting of the steps of:
   (a) depositing target material on a transparent substrate having macro pre-patterns formed thereon, said macro pre-patterns having a top surface and side surface;
   (b) transferring all of the target material from the transparent substrate to form a single layer of the target material on the side surface of the macro pre-patterns by etching, thereby fabricating target material-macro pre-pattern composite structures; and
   (c) removing only the macro pre-patterns from said target material-macro pre-pattern composite structures, thereby forming three-dimensional nanostructures of the target material;
   wherein the target material is selected from the group consisting of gold, platinum, silver, copper, nickel, iron, titanium, molybdenum, chromium, indium tin oxide (ITO), and mixtures thereof; and
   wherein the single layer of target material is not deposited on the top surface of the macro pre-patterns;
   wherein the single layer of target material is deposited to a thickness of 15 nm or less; and
   wherein the three-dimensional nanostructures of target material are in direct contact with the transparent substrate.

2. The method for fabricating three-dimensional nanostructures according to claim 1, wherein the macro pre-patterns are obtained by depositing a macro pre-pattern material on a substrate and carrying out a lithography process or an imprinting process.

3. The method for fabricating three-dimensional nanostructures according to claim 1, wherein the substrate is selected from the group consisting of polyethylene terephthalate, polyacylate, polyethylene, quartz, glass, silicon, silicon oxide and mixtures thereof.

4. The method for fabricating three-dimensional nanostructures according to claim 1, wherein the pre-pattern material is selected from the group consisting of polystyrene, chitosan, polyvinyl alcohol, polymethylmethacrylate, photoresist and mixtures thereof.

5. The method for fabricating three-dimensional nanostructures according to claim 1, the etching is milling or sputtering.

6. The method for fabricating three-dimensional nanostructures according to claim 5, the milling is carried out by forming plasma using a gas under a pressure of 0.1-10 mTorr, and then accelerating the plasma in the range of 100-5,000 eV.

7. The method for fabricating three-dimensional nanostructures according to claim 1, further comprising a step of forming a pattern protective layer after the step (c) of removing the macro pre-patterns.

8. A method of fabricating three-dimensional nanostructures of a target material using macro pre-patterns, the method essentially consisting of the steps of:
   (a) depositing target material on a transparent substrate and forming macro pre-patterns thereon, said macro pre-patterns having a top surface and side surface;
   (b) transferring all of the target material from the transparent substrate to form a single layer of the target material on the side surface of the macro pre-patterns by etching, thereby fabricating target material-macro pre-pattern composite structures; and
   (c) removing only the macro pre-patterns from said target material-macro pre-pattern composite structures, thereby forming three-dimensional nanostructures of the target material;
   wherein the target material is selected from the group consisting of gold, platinum, silver, copper, nickel, iron, titanium, molybdenum, chromium, indium tin oxide (ITO), and mixtures thereof; and
   wherein the single layer of target material is not deposited on the top surface of the macro pre-patterns;
   wherein the single layer of target material is deposited to a thickness of 15 nm or less; and
   wherein the three-dimensional nanostructures of target material are in direct contact with the transparent substrate.

* * * * *